United States Patent [19]

Luft

[11] 4,166,230
[45] Aug. 28, 1979

[54] SLOTTED, ELECTRODED PIEZOELECTRIC WAFER FOR ELECTRO-OPTIC DEVICES

[75] Inventor: Victor Luft, Minneapolis, Minn.

[73] Assignee: Honeywell Inc., Minneapolis, Minn.

[21] Appl. No.: 865,822

[22] Filed: Dec. 30, 1977

[51] Int. Cl.² ................................ H01L 41/10
[52] U.S. Cl. ................................ 310/365; 310/363; 310/369; 350/356
[58] Field of Search .............. 310/367, 369, 334, 363, 310/365, 328; 350/150, 356

[56] References Cited

U.S. PATENT DOCUMENTS

| | | | |
|---|---|---|---|
| 3,036,231 | 5/1962 | Henry | 310/367 X |
| 3,059,130 | 10/1962 | Robins | 310/369 X |
| 3,609,002 | 9/1971 | Fraser et al. | 350/150 |
| 3,704,512 | 12/1972 | Siegel | 350/356 X |
| 3,737,211 | 6/1973 | Cutchen et al. | 350/356 |
| 3,804,489 | 4/1974 | Li et al. | 350/356 |
| 3,873,187 | 3/1975 | Brooks | 350/356 |
| 3,893,215 | 7/1975 | Yasar | 310/363 X |

*Primary Examiner*—Mark O. Budd

[57] ABSTRACT

An electroded wafer for use in electro-optic devices comprising a ceramic wafer having piezoelectric properties and having faces substantially larger than the thickness of the wafer. On the wafer are a plurality of parallel slots cut in at least one face of said wafer to form an interdigital matrix wherein adjacent slots are cut through the periphery of the wafer at opposite ends. Further included is a metallic electrode plated on the interior of the slots and the periphery of the wafer by electroless plating of at least one metal in contact with a palladium catalyzing compound such that the catalyzing compound is present only on the portions of the wafer to be plated.

6 Claims, 1 Drawing Figure

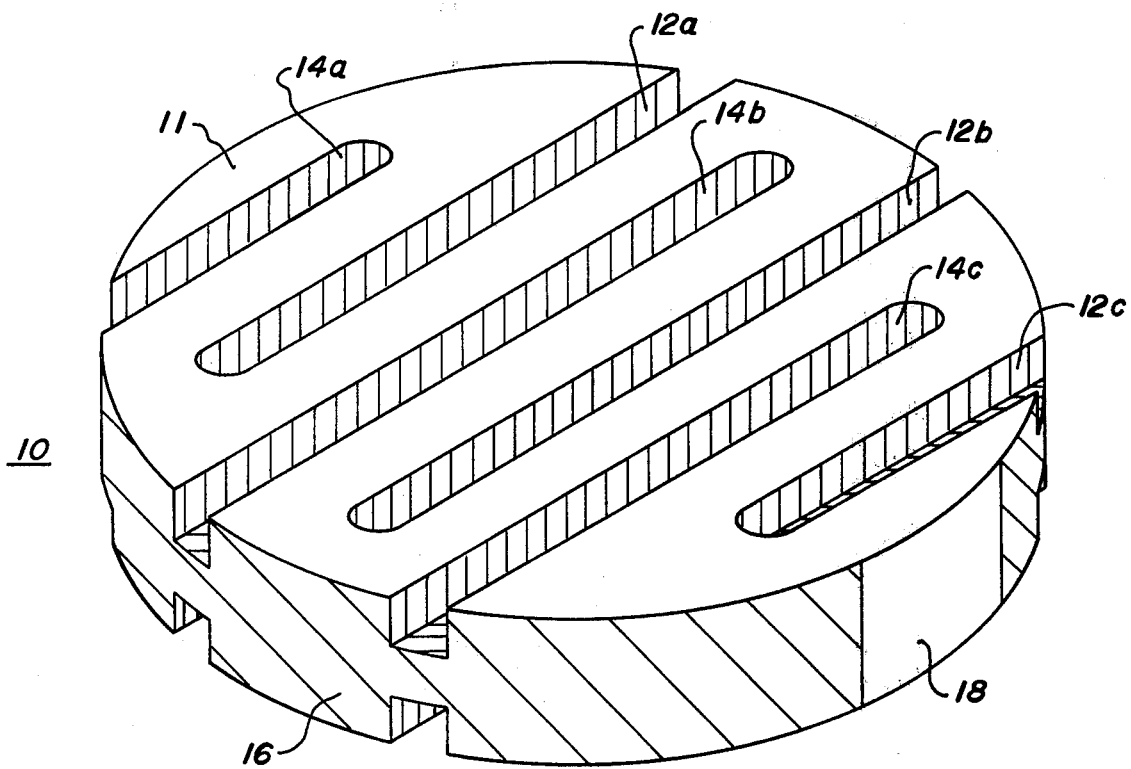

SLOTTED, ELECTRODED PIEZOELECTRIC WAFER FOR ELECTRO-OPTIC DEVICES

BACKGROUND OF THE INVENTION

Electro-optic devices have in the recent past begun to employ electrode wafers as a part of the electro-optic system. Ceramic wafers having piezoelectric properties have been found to be suitable for devices in which the adjustment of voltage will adjust in some manner the transparency of the electroded wafer being used as a lens. For example, in the journal, *Ferroelectrics*, 1976, Vol. 10, pp. 47–51, a stereoscopic viewing system using PLZT ceramics in a new electro-optic shutter viewing device is described for use with stereoscopic real-time television and computer-driven CRT display systems. Other uses for ceramic wafers having piezoelectric properties include the use of these wafers as lenses in the goggles for protection against flash blindness.

One of the most important aspects in preparing an electroded wafer for use in electro-optic devices is to ensure that the electroded wafer responds in an optimum manner to the electronics of the system. This requires the application of an electrode to the wafer which is strong, durable, easy to apply, and effective.

It has been proposed in the past to apply surface electrodes such as in U.S. Pat. No. 3,609,002, in which a plurality of interconnected interdigital electrodes are placed on the surface of a ferroelectric ceramic material for use in an electro-optic system. As an alternative to the surface electrodes in the previously described reference, a three-dimensional effect is achieved in U.S. Pat. No. 3,540,427 where a technique for fabricating an array of very high-speed light deflecting units is described.

An improvement on this previously described patent is contained in U.S. Pat. No. 3,704,512, in which a plurality of parallel slots are cut into the body of an electro-optic crystal and filled with an electrically conductive foil that is made to adhere to the walls of the slot using an electrically conductive adhesive. Nevertheless, all of these prior art methods are inadequate to provide the plurality of electrodes in a ceramic wafer of sufficiently small size to permit use in the more sophisticated electro-optic systems presently envisioned. Applications of metal coatings themselves are well known in the art, as exemplified by U.S. Pat. No. 2,278,722, which concerns a method for obtaining, through a wet method and in the absence of an external electric source, a very adhesive deposit of a metal on a polished metal or on other surfaces such as glass, ceramic, metals, mica, or films of cellulose. U.S. Pat. No. 2,421,079, discloses a method for adhering metal to nonconductive materials such as glass, ceramics, leather, and other materials by the use of stannous fluroborate. Similarly, U.S. Pat. No. 2,757,104 discloses the use of stannous chloride as a sensitizing agent for depositing thin conductive films of metal to electrical resistors.

U.S. Pat. No. 3,011,920 discloses a method for electroless metal deposition used in the manufacture of printed electrical circuits and the like by the deposition on a clean substrate by catalyzing the substrate through a treatment with a bath containing collodial particles of a catalyst metal using palladium catalysts. Metal films of improved uniformity are disclosed in U.S. Pat. No. 3,798,050, using a buffered palladium solution in contact with the glass or other material being plated.

Nevertheless, it does not appear in the prior art a simple, efficient method for manufacturing an electroded wafer for use in electro-optic devices wherein the electrodes are strong, adherent, and sufficiently positioned with respect to each other to operate with the intender's electronic circuitry for which the electrode wafer would be useful.

BRIEF DESCRIPTION OF THE INVENTION

Accordingly, it has now been discovered that an electroded wafer can be provided according to the principles of this invention for use in electro-optic devices. This wafer comprises a ceramic wafer having piezoelectric properties and having faces substantially larger than its thickness. A plurality of parallel slots are cut in at least one face of the wafer to form an interdigital matrix wherein adjacent slots are cut through the periphery of the wafer at opposite ends. A metallic electrode is plated on the interior of the slots and on the periphery of the wafer by electroless plating of at least one metal in contact with a palladium catalyzing compound. The compounds catalyzing the ceramic is present only on the interior of said slots and along the periphery. It is preferred that the slots represent at least 75 to as much as 99 percent of a full cut on the face. It is preferred that the slots have a ratio of depth to width ranging from 0.5/1 to 20/1 and the metallic electrode is the uniform thickness ranging from 2 KA° to 15 KA°.

In a preferred embodiment, both sides of the wafer are cut with identical slots forming a mirror image of each other, thereby placing each slot on one side directly above the identical slot on the other side of the wafer. Typically, the slots range from 1.5 to 2.0 mils in width and are approximately 1.0 to 5.0 mils deep. Initial plating may be done with a less noble metal such as nickel followed by plating to a thickness of approximately 0.1 micrometers with a noble metal such as gold to improve conductivity.

An efficient manner for applying the palladium sensitizing compound is to coat the entire wafer with such a palladium sensitizing compound to form a layer on all parts of the wafer. Then, the palladium sensitizing compound is removed from both faces of the wafer, leaving a quantity of the catalyst deposited in the grooves or slots and on the periphery of the wafer. Alternatively, the faces of the wafer may be masked to present plating on the faces. A portion of the periphery may be further cleaned to provide two diametrically opposed areas of from as little as 1/1000th to as much as ⅓rd of the circumference to thereby separate the interdigitally arranged slots into positive and negative electrodes.

DETAILED DESCRIPTION OF THE INVENTION

For a more complete understanding of the invention, reference is hereby made to the Drawing in which the FIGURE represents a schematic view of a preferred embodiment of this invention.

An electroded wafer 10 has two faces 11 which are substantially larger than the thickness of the wafer. A plurality of grooves 12A, 12B through 12E, are cut in at least one face 11 of the wafer along with a second plurality of slots 14A, 14B through 14E, to form an interdigital matrix wherein adjacent slots 12A and 14A are cut through the periphery of the wafer at opposite ends. A metallic electrode is plated on the interior of slots 12A through 12E and 14A through 14E and on the periphery 16 of the wafer by electroless plating of at least one metal. The plating is carried out in contact with a palladium catalyzing compound which is present only on the interior of said slots 12A through 12E and 14A through 14E and said periphery 16. An open area 18 which is not electrically conductive is provided on the periphery to separate the electrode connections between alternating slots 12 and 14. This may be accomplished either prior to metallization by removing the palladium catalyzing material from this portion of the periphery or by removing the metal after metallization.

Normally, it is preferred that the slots range from 75 to 99 percent of the full cut on the face 11 of the wafer. These slots should preferably be from approximately 1 to 2 mils in width, with a depth of approximately 0.5 to 20 mils. The metallic electrode plated by the electroless plating method in the interior of the slots 12 and 14 and on the periphery 16 should be a uniform thickness from about 2 KA° to 15 KA°. As shown in the FIGURE, slots may be provided on both sides or faces 11 of the electroded wafer 10. In this manner, a more responsive wafer is provided for integration into the electronic circuitry of the electro-optic device.

The basic slotting and metallizing process consists primarily of four main steps. The slots are cut on one or both sides of a piezoelectric wafer to provide for the required interdigital pattern. The entire wafer is then coated with a thin layer of palladium by chemical deposition. The palladium is mechanically removed from the unwanted portions of the ceramic wafer and the conductor metal is chemically deposited on the remaining palladium coated surfaces by electroless plating. Alternately, the faces may be masked.

A preferred slotting technique employs the use of a diamond impregnated nickel saw blade rotating at high speed, in the order of 18,000 revolutions per minute, wherein the ceramic wafer is held in place by means of a vacuum chuck which is operably moved to automatically index the position of the wafer with respect to the saw blade. Thus, an interdigital pattern can be cut in the wafer. One method of accomplishing the interdigital cutting is to employ a circular or rotating saw blade and a graphite template near the periphery. The saw progresses across the ceramic wafer until it makes electrical contact with the soft graphite conductive template. The resulting electrical impulse completes a circuit which immediately causes the chuck to reverse travel and the blade then passes back through the slot. After cutting all of the slots in one direction, the wafer may be rotated 180° to permit cutting of the adjacent electrodes.

After the cutting of the interdigital pattern has been completed, the ceramic wafer should be cleaned, preferably by ultrasonically degreasing and bathing in hot alkaline cleaner. The entire wafer is then coated with a thin layer of palladium by chemical deposition. This process of chemically depositing palladium on a ceramic surface is well known and is set forth in at least one of the prior references stated in the Background of the Invention section of this specification. Due to the relatively small size of the slots being cut in the wafer, it is important to periodically filter the chemical solutions to keep them free of particles which could be lodged in one of the ceramic wafer slots.

The next step comprises the removal of the palladium from those surfaces which are not to form part of the electrode portion of the electroded wafer. This may be accomplished by rubbing with an absorbent pad of any material which has tightly bound fibers to prevent wedging of an occasional loose fiber in one of the slots. This pad is soaked with a cerium oxide polishing compound in water to remove the undesired palladium. The wafer is then ultrasonically cleaned in water to help remove any polishing compound and/or other particles adhering within the slots. If it is impractical to polish the surface to remove the undesired palladium, masking technique can be used.

Finally, the conductor metal is electrolessly plated on the wafer. The wafer is immersed in an electroless nickel plating solution for an approximate time length which will result in desired metal thickness. Typically, this is five to ten minutes. The electroless nickel will deposit only on the areas of the ceramic wafer which have a tin and palladium coating thereon. Thus, the surface of the wafer will not be coated with the metal. In addition, if the palladium catalyzing material has been removed from a portion of the periphery to separate the two sets of electrodes, this area will also not be coated by the nickel. The ceramic wafer is then immersed in an electroless gold plating solution to deposit approximately 0.1 micrometers of gold to improve the conductivity of the electrodes. If it is desired, the insulator region separating the two electrodes may be formed at this time by use of fine emery paper or other abrasive materials on the periphery.

The resulting electroded wafer may be employed in a wide variety of electro-optic devices, such as optical shutters and the like wherein the electroded wafer contains electrodes which are rugged, strongly adherent, and finely spaced to permit use with complicated and sophisticated electronic circuitry without the high voltage demand of surface electrodes.

Other embodiments of the present invention will become apparent to those skilled in the art.

Having thus described the invention, what is claimed is:

1. An electroded wafer for use in electro-optic devices, comprising:
   a ceramic wafer having piezoelectric properties and having faces substantially larger than its thickness;
   a plurality of parallel slots cut in at least one face of said wafer to form an interdigital matrix, wherein adjacent slots are cut through the periphery of the wafer at opposite ends;
   a metallic electrode plated on the interior of said slots and periphery of said wafer by electroless plating of at least one metal, said plating being formed under contact of a palladium catalyzing compound, said compound being present only on the interior of said slots and said periphery.

2. The wafer of claim 1, wherein said slots are 75 to 99 percent of the full cut on said face.

3. The wafer of claim 1, wherein said slots have a ratio of depth to width ranging from 0.5/1 to 20/1.

4. The wafer of claim 1, wherein said slots have a width ranging from 1.0 mil to 2.0 mils, and a depth from 0.5 mil to 20 mils.

5. The wafer of claim 1, wherein said metallic electrode is of uniform thickness of from 2 KA° to 15 KA°.

6. The wafer of claim 1, wherein said interdigital slots are cut on both faces of said wafer and are positioned above one another in a mirror image.

* * * * *